United States Patent [19]
Sakata

[11] Patent Number: 5,580,818
[45] Date of Patent: Dec. 3, 1996

[54] FABRICATION PROCESS FOR SEMICONDUCTOR OPTICAL DEVICE

[75] Inventor: Yasutaka Sakata, Tokyo, Japan

[73] Assignee: NEC Corporation, Tokyo, Japan

[21] Appl. No.: 430,619

[22] Filed: Apr. 28, 1995

[30] Foreign Application Priority Data

Apr. 28, 1994 [JP] Japan ............................ 6-111884

[51] Int. Cl.$^6$ ........................................ H01L 21/20
[52] U.S. Cl. ................... 437/129; 437/89; 148/DIG. 95
[58] Field of Search ............. 437/129, 89; 148/DIG. 95

[56] References Cited

U.S. PATENT DOCUMENTS

| | | | |
|---|---|---|---|
| 4,077,817 | 3/1978 | Bellavance | 437/129 |
| 4,114,257 | 9/1978 | Bellavance | 437/129 |
| 4,961,198 | 10/1990 | Ishino et al. | 372/50 |
| 5,382,543 | 1/1995 | Nakamura et al. | 437/129 |
| 5,436,195 | 7/1995 | Kimura et al. | 437/129 |
| 5,450,437 | 9/1995 | Shim et al. | 372/96 |

FOREIGN PATENT DOCUMENTS

| | | |
|---|---|---|
| 0501751A1 | 9/1992 | European Pat. Off. . |
| 0558089A2 | 9/1993 | European Pat. Off. . |
| 100291 | 4/1992 | Japan . |
| 82909 | 4/1993 | Japan . |
| 327112 | 12/1993 | Japan . |
| 327111 | 12/1993 | Japan . |

OTHER PUBLICATIONS

T. Sasaki et al., "Monolithically integrated multi-wavelength MQW-DBR laser diodes fabricated by selective metalorganic vapor phase epitaxy," Journal of Crystal Growth 145 (1994) pp. 846–851.

Patent Abstracts of Japan; vol: 17, No. 128; JPA 4303982; Oct. 27, 1993.

Electronics Letters, 28:2; "DFB–LD/Modulator Integrated Light Source by Bandgap Energy Controlled Selective MOVPE"; pp. 153–154; (1992).

Electronics Letters, 27:23; "Novel Structure MQW Electroabsorption Modulator/DFB–Laser Integrated Device Fabricated by Selective Area MOCVD Growth"; pp. 2138–2140; (1991).

H. Soda, "High–Power and High–Speed Semi–Insulating BH Structure Monolithic Electroabsorption Modulator/DFB Laser Light Source"; Electronics Letters, vol. 26, pp. 9–10 (Jan. 4, 1990).

M. Aoki et al, "Novel Structure MQW Electroabsorption Modulator/DFB–Laser Integrated Device Fabricated by Selective Area MOCVD Growth", Electronics Letters, vol. 27, pp. 2138–2140 (Nov. 7, 1991).

Kato et al., "DFB–LD/Modulator Integrated Light Source by Bandgap Energy Controlled Selective MOVPE", Electronics Letters, vol. 28, pp. 153 to 154 (Jan. 16, 1992).

Primary Examiner—R. Bruce Breneman
Assistant Examiner—Linda J. Fleck
Attorney, Agent, or Firm—Sughrue, Mion, Zinn, Macpeak & Seas

[57] ABSTRACT

A SiO$_2$ mask is formed on an n-type InP substrate. The mask gap width is narrower in a region I (laser region) and wider in a region II (modulator region). With taking the mask as growth blocking masks, an optical guide layer of InGaAsP, an MQW active layer of InGaAs well layer and InGaAsP barrier layer, p-type InP layer are selectively grown. By removing a part of the mask, p-type InP clad layer and p-type InGaAs cap layer are formed. By this, regions having mutually different bandgap can be formed through one selective growth process. Also, it becomes possible to form the regions having large bandgap difference while avoiding lattice mismatching.

4 Claims, 10 Drawing Sheets

FABRICATION PROCESS FOR SEMICONDUCTOR OPTICAL DEVICE

BACKGROUND OF THE INVENTION

1. Field of the Invention

The present invention relates to a fabrication process for a semiconductor optical device integrating a plurality of optical semiconductor elements, such as laser diode (LD) and so forth, on a common substrate.

2. Description of the Related Art

Application of semiconductor optical elements, such as a semiconductor laser, a semiconductor optical modulator, a semiconductor optical switch and so forth, to optical fiber communication, optical measurement, optical switching and so on has been widely studied. In the recent years, monolithically integrated semiconductor optical devices have been attracting attention as devices enabling down-sizing and lowering of cost of the devices and enabling significant improvement of optical coupling efficiency between elements.

Upon monolithic integration of semiconductor optical elements having mutually different applications and functions, it becomes necessary to form a plurality of regions having different bandgap energy in a common semiconductor substrate. This is due to difference in operation wavelengths (bandgap energy) of respective semiconductor optical elements. Typical conventional fabrication process of the monolithically integrated semiconductor optical device will be discussed hereinafter.

FIG. 1 is a section of an integrated semiconductor optical device integrating a distributed feedback laser (DFB) and an electroabsorption modulator reported by H. Soda et al. in "HIGH-POWER, AND HIGH-SPEED SEMI-INSULATING BH STRUCTURE MONOLITHIC EELECTROABSORPTION MODULATOR/DFB LASER LIGHT SOURCE", Electronics Letters, Vol. 26, Pp. 9–10 (1990) (first prior art).

In the fabrication process of the semiconductor optical device shown in FIG. 1, after providing a diffraction grating 201a in a laser side region on n-type InP substrate 201, an optical guide layer 203, an etching stopper layer 212 and a laser active layer 204a are grown as a laser region layer structure on the entire surface of the substrate.

Subsequently, laser active layer 204a in a region to form the modulator is removed by selective etching. Then, by burying regrowth, an optical absorption layer 204b forming a butt-joint structure with the laser active layer 204 is formed. Subsequently, on the entire surface, p-type InP clad layer 206 and a cap layer 207 are grown. Finally, by removing a part of the cap layer 207 and protecting the relevant portion with an insulation layer 211, p-side electrode 209 is formed on the epitaxial layer side, and n-side electrode 210 is formed on the substrate side.

While relatively high optical coupling efficiency higher than or equal to 80% can be attained between the laser and the modulator with the construction set forth above, sufficient controllability cannot be achieved in the etching and burying regrowth steps. Therefore, a problem is encountered in that satisfactory structures cannot be fabricated with reasonably high reproductivity.

As a solution for this, it is reported in M. Aoki et al, "NOVEL STRUCTURE MQW ELECTROABSORPTION MODULATOR/DFB-LASER INTEGRATED DEVICE FABRICATED BY SELECTIVE AREA MOCVD GROWTH" Electronic Letters, Vol. 27, pp. 2138–2140 (1991) (second prior art), a fabrication process of an integrated-type semiconductor optical device, in which optical waveguides for two regions can be formed by a single epitaxial growth process by utilizing a metal organic vapor phase epitaxy (MOVPE), thereby eliminating necessity of the burying regrowth process. Similar technology has been proposed in Japanese Unexamined Patent Publication (Kokai) No. Heisei 4-100291 (third prior art).

FIGS. 2A to 2C are perspective and sectional views showing sequence of steps in the fabrication processes as proposed in the second and third prior arts.

In the fabrication process proposed in both publications, as shown in FIG. 2A, a pair of $SiO_2$ mask 302 (mask width is several tens to several hundreds μm) serving as growth blocking mask are formed with a several tens μm of interval (gap), are formed only on a laser region on a n-type InP substrate 301.

Subsequently, as shown in FIG. 2B, an optical guide layer 303, an active layer 304, a clad layer 306 and a cap layer 307 are sequentially grown by the MOVPE selective growth method on the portion not covered by the $SiO_2$ mask 302 on the surface of the n-type InP substrate 301.

Next, as shown in FIG. 2C, a $SiO_2$ mask 302a is selectively formed on the cap layer 307. With taking the $SiO_2$ mask 302a as mask, 1.5 to 2.0 μm width of optical waveguide is formed by performing mesa-etching for both of the laser region and the modulator region. Subsequently, with taking the $SiO_2$ mask 302a as mask, Fe doped InP layer 313 serving as high resistance layer is formed at both sides of the optical waveguide.

Namely, in this prior art, an etching step of the semiconductor is required for forming the optical waveguide, precise control is required in the fabrication process to causing degradation of yield.

Kato et al., "DFB-LD/MODULATOR INTEGRATED LIGHT SOURCE BY BANDGAP ENERGY CONTROLLED SELECTIVE MOVPE", Electronics Letters, vol. 28, pp 153 to 154 (1992) (fourth prior art) reports other fabrication process of an integrated light source constituted of a DFB laser and an optical modulator.

In the fabrication process of the semiconductor device, growth blocking masks are formed both in the region I where the DFB laser is formed and in the region II where the modulator is formed, as shown in FIG. 3A. Namely, on the n-type InP substrate 401, a $SiO_2$ mask 402 common to the regions I and II is formed. The mask width Wm is wider in region I than in region II. Here, a mask gap width W0 defining an active region is formed in equal width in both regions.

Thereafter, by MOVPE selective growth method, an optical guide layer, a multiple-quantum well (MQW) and p-type InP layer are formed.

In this prior art, utilizing the feature that the bandgap energy of the waveguide can be controlled by varying the mask width of the growth blocking mask upon MOVPE selective growth, a junction structure of the DFB laser and the optical modulator having approximately 100% of optical coupling efficiency can be realized by one growth sequence.

FIG. 3B is a graph showing a relationship between the mask width Wm and a bandgap wavelength of an active layer formed therebetween. As shown in FIG. 3B, by setting the mask width Wm of the growth blocking mask at 10 μm on the laser side and 3 μm on the modulator side, the bandgap energy can be varied as much as 58 meV (converted into the bandgap wavelength of 120 nm).

Also, in the fourth prior art, since the optical waveguide is directly formed by the MOVPE selective growth method, the step of forming the optical waveguide by mesa-etching of the semiconductor is unnecessary and thus the fabrication process of the integrated semiconductor optical device can be simplified. Therefore, it becomes possible to fabricate this optical device with high controllability and reproductivity.

In the first prior art (FIG. 1) reported by Soda et al., since a cut-and-paste like manner of selective etching and burying regrowth is employed, precise control of fabrication process is required to match the wavelength. Therefore, a problem of low reproductivity is encountered. Also, since two optical waveguides are formed by two separate epitaxial growth processes, increased number of process steps are required resulting in a low yield.

In the second and third prior arts (FIGS. 2A to 2C) as disclosed in Aoki et al. and Japanese Unexamined Patent Publication No. Heisei 4-100291, since two active layers are simultaneously formed through the single epitaxial growth step, reduction of number of process steps and improvement of yield can be achieved. In these prior arts, however, to realize an optical waveguide for the fundamental transverse mode, mesa-etching method is inherently used, leading to difficulty of reproductivity and causing a problem in uniformity of the products.

The process reported by T. Karo et al. (fourth prior art: FIGS. 3A and 3B), since the selectively grown active layer is used as is as the optical waveguide, the problems in the foregoing first to third embodiments can be basically solved. However, in the fourth prior art, since the bandgap energy difference between two the regions cannot be made large enough, application is limited.

The followings are the reasons why the bandgap energy difference between two regions cannot be made large. When mask width is varied, due to difference of decomposition rate of material species on the mask, crystal composition is varied to cause a problem of lattice-mismatch. For example, in case of the laser for the 1.55 μm-band, the layer thickness of the MQW active layer is typically in the order of 0.1 μm. In order to make the critical thickness at which crystal defects are introduced in the layer to be thicker than or equal to 0.1 μm, lattice-mismatch should be restricted to be smaller than or equal to 15%. When the difference of the mask width is restricted to 10 μm, for instance, effective bandgap energy difference possible to be realized, is derived by extrapolating the curve of FIG. 3B, to be 75 meV. Thus, in the fourth prior art, the bandgap energy difference between two regions cannot be greater than 75 meV.

As is known in the art, concerning the characteristics of the optical modulator, extinction characteristics is improved at greater optical confinement factor, that is at greater layer thickness. Whereas, in the fourth prior art, since lattice-mismatch is caused during selective growth, thick layers cannot be formed making it difficult to improve the extinction characteristics.

In the integrated semiconductor optical device, it is desired to form two regions having large bandgap energy difference on a common substrate. Greater bandgap energy difference is required for the following reason.

Currently, the wavelength of the semiconductor laser to be employed in optical communication is primarily 1.3 μm band. In the future, it is expected that communication in the 1.55 μm band, at which the loss in the optical fiber becomes minimum, will be increased. Accordingly, as a terminal for optical communication, it becomes necessary to cover both the 1.55 μm band and the 1.3 μm band.

On the other hand, in order to realize wavelength division multiplexing (WDM) communication, it is necessary to make it possible to input a plurality of semiconductor lasers oscillating at different wavelength into a single optical fiber. Then, in order to realize such a system by the monolithic semiconductor optical device, it is desired to combine plurality of laser lights into one using an optical waveguide, and subsequently, coupling them to an optical fiber. In this case, in order to suppress the optical propagation loss in the waveguide, it becomes necessary to set the bandgap of the waveguide to be sufficiently shorter than the respective laser oscillation wavelengths. Therefore, it is necessary to form a laser having a 1.55 μm oscillation wave length, and a waveguide whose effective band gap wavelength is less than or equal to 1.3 μm simultaneously. In terms of energy, the energy difference greater than or equal to 150 meV has to be realized.

SUMMARY OF THE INVENTION

It is an object of the present invention to provide a fabrication process for a semiconductor optical device with a plurality of regions having a plurality of bandgap energies with high optical coupling efficiency.

Another object of the present invention is to allow the forming of a structure of a semiconductor optical device with high reproductivity and high yield.

A further object of the present invention is to allow the forming of a thick waveguide without degrading crystallinity of the epitaxial layer.

An yet another object of the present invention is to allow the simultaneously forming of a plurality of regions having a large bandgap energy difference on a common semiconductor substrate.

A fabrication process for a semiconductor optical device according to the present invention, comprises:

first step of forming a pair of growth blocking masks on a first conductive type compound semiconductor layer to define a plurality of gap regions in-between said pair of masks, said plurality of gap regions having different gap width in optical waveguiding direction; and second step of selectively forming active region including quantum well and a second conductive type semiconductor layer in said plurality of gap regions by selective epitaxial growth.

Preferably, the pair of growth blocking masks are formed to have an equal mask width to each other through the entire length of the mask waveguiding direction. Alternatively, the growth blocking masks may have narrower mask width at the region having wider gap width than that region having narrower gap width.

The present invention is characterized by forming a pair of growth blocking masks defining a plurality of regions having different gap widths in-between the masks, and having controlled mask widths in the waveguide direction, and then selectively growing an active layer including MQW, utilizing the mask. The present invention thus achieves the following effects.

First of all, it becomes possible to directly form waveguide structures having different bandgaps on a common substrate in one selective growth process. Therefore, the integrated semiconductor optical device can be fabricated with high reproductivity and high yield.

Secondly, when the mask width is the same in all regions and kept constant through the entire length, semiconductor regions having different bandgaps can be provided while maintaining the same semiconductor composition in respective regions without causing lattice-mismatch.

Thirdly, when the mask width is narrower in the region having wider mask gap width, greater bandgap difference between the regions can be provided while restricting the lattice-mismatch to a low value. Accordingly, application field of the integrated semiconductor optical device can be expanded.

Fourthly, since lattice-mismatch can be restricted, thicker optical waveguide can be formed. This contributes to the improvement of modulator characteristics, for example.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiment of a semiconductor optical device fabrication process will be discussed hereinafter for facilitating better understanding of the invention with reference to the drawings, particularly to FIGS. 4 to 10. In the following description, numerous specific details are set forth in order to provide a thorough understanding of the present invention. It will be obvious, however, to those skilled in the art that the present invention may be practiced without these specific details. In other instance, well-known structures are not shown in detail so as not to unnecessary obscure the present invention.

Figure 4A:
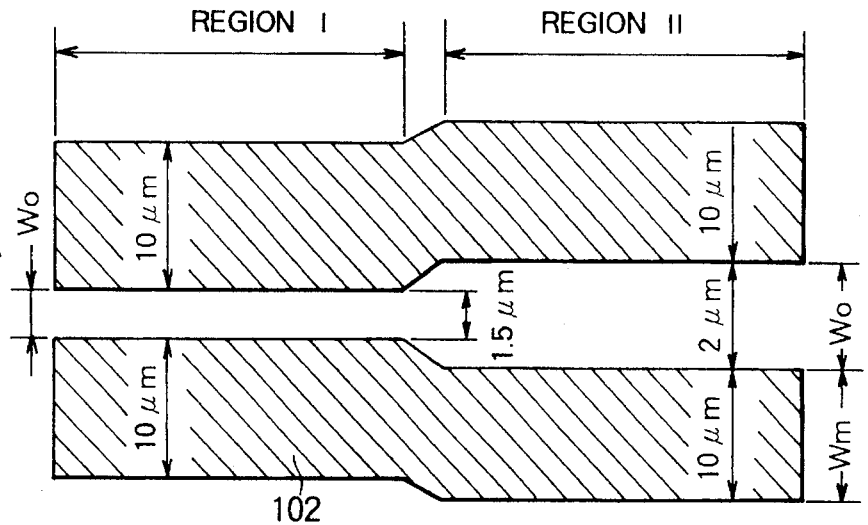
FIGS. 4A and 4B are illustration of mask patterns for discussing effect of the present invention.
Figure 4B:
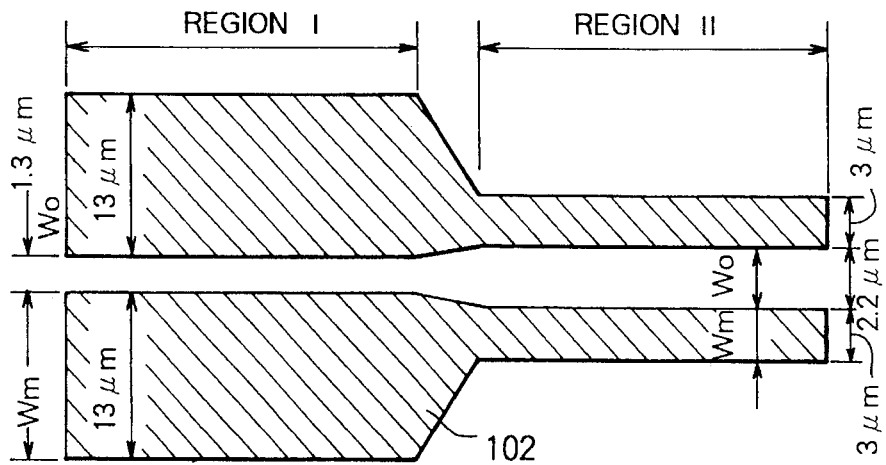

Examples of mask configurations of growth blocking masks in MOVPE selective growth method to be employed in the preferred embodiment of a semiconductor optical device fabrication process according to the invention are shown in FIGS. 4A and 4B. As shown, a $SiO_2$ mask 102 to be employed in the present invention is formed in a pair on a semiconductor substrate (e.g. InP substrate). A width of the gap W0 between the masks is differentiated in a region I and a region II. Namely, the width of the region I is narrower and the width of the region II is wider.

In the present invention, as shown in FIGS. 4A and 4B, the gap width W0 between the masks is varied at respective regions. Growth rate is thus varied. The reason is that, in the region having wider gap width, relative gas molecule concentration becomes lower due to larger amount of consumed material to cause lowering of the growth rate. Therefore, in region I, a thicker semiconductor active layer (e.g. well layer: InGaAs, barrier layer: InGaAsP) and hence a thicker quantum well layer can be formed as compared with region II. Accordingly, a bandgap of the semiconductor layer in region I can be thus made smaller than that of the region II.

Figure 5:
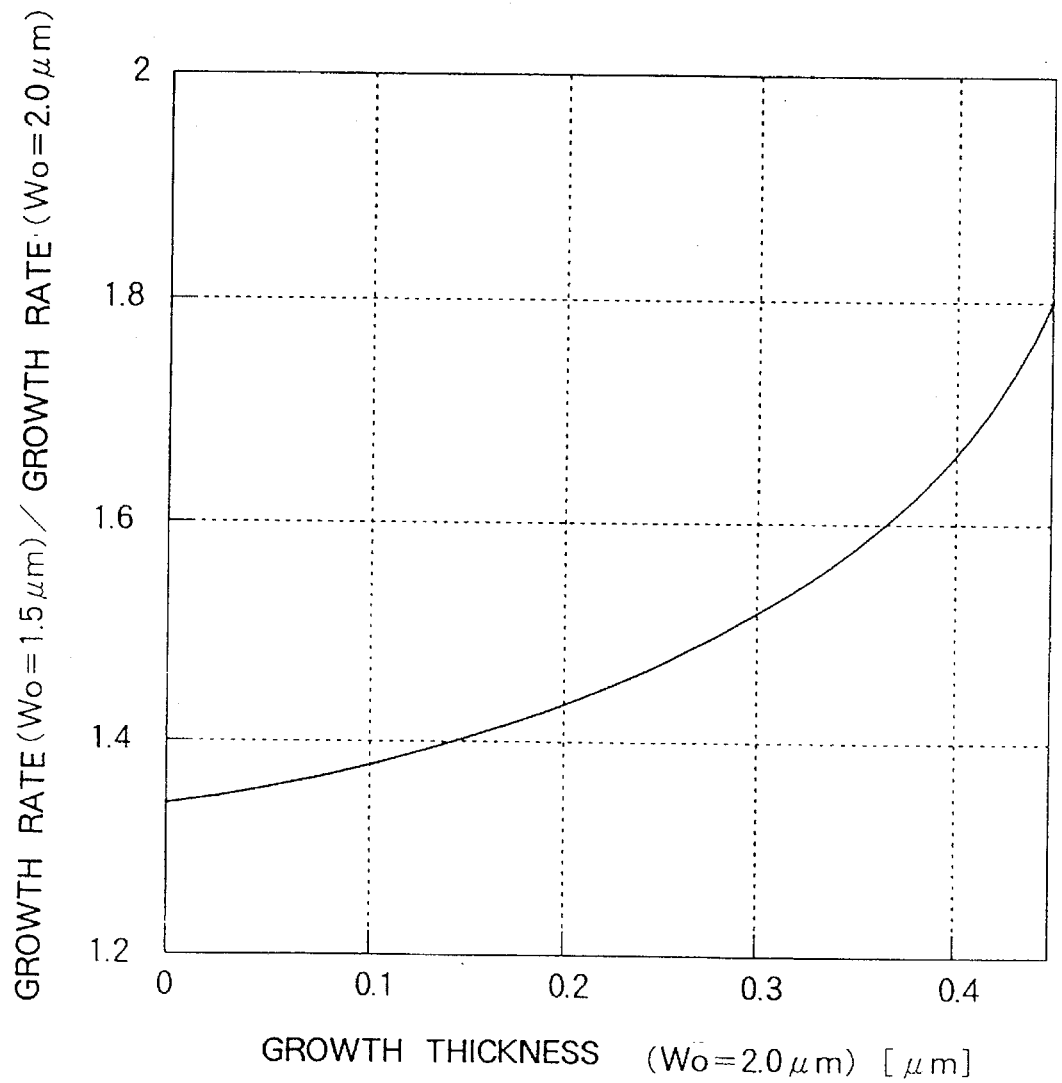
FIG. 5 is a growth characteristic curve for explaining the effect of the present invention.

FIG. 5 is a graph showing mask gap width W0 dependence of the growth rate when the mask widths in both regions are 10 μm in common; and when the mask width in region I is 1.5 μm and in region II is 2.0 μm. In this figure, the grown layer thickness in the region II is represented by the values on the horizontal axis and the growth speed ratio between the regions is represented by the values on the vertical axis.

As shown in FIG. 5, in comparison of the case where the mask gap widths W0 are respectively 1.5 μm and 2.0 μm in the regions I and II, assuming that the height of the position of the laser active layer is in a range of 0.1 μm to 0.3 μm, the region having a mask gap of 1.5 μm is expected to achieve 1.4 to 1.5 times higher growth rate than that of the region having a mask gap of 2.0 μm.

Assuming that 1.5 times higher growth rate is attained, when a quantum well structure (well width 5.0 nm) to have a bandgap wavelength of 1.49 μm is grown in the region of W0=2.0 μm, the bandgap wavelength of the quantum well structure (well width is increased to 7.5 nm) in the region of W0=1.5 μm, becomes 1.55 μm. As set forth above, by merely varying the mask gap width W0, 60 nm bandgap difference (32 meV in energy) can be attained. It should be noted that the foregoing is based on the assumption of multiple-quantum well structure of InGaAs well layer and InGaAsP barrier layer of 1.13 μm composition.

In this example, since the mask width is constant, crystal composition is not varied between the regions of different mask gaps (the region having narrower mask gap and the region having wider mask gap). Therefore, the shown embodiment does not cause variation of the crystal composition and distortion of grating which were caused in the fourth prior art, in which regions having different bandgap wavelength were formed by varying the mask width. Therefore, according to the present invention, thick layer waveguide can be formed without being troubled by the problem of lattice-mismatching.

In the example of FIG. 4B, in addition to the difference of the mask gaps W0 between the regions I and II, mask width is also varied. With the structure thus constructed, in addition to the effect of varying the mask gap width W0, effect of the difference of the mask width Wm can be attained.

The effect attained by varying the mask width may be summarized by (1) difference of growth rate and (2) variation of composition.

Difference of Growth Rate

In the region between the wider masks, the growth speed becomes accelerated in comparison with the region between the narrower masks. Its mechanism is that, at firstly, the material supplied on the mask is supplied to the growth region through migration on the mask, and, secondly, the material species is diffused by concentration gradient in the gas phase. That is, while the material is consumed in the growth region, the material is not consumed in the mask region resulting in a concentration gradient. As a result of this, diffusion of material from the mask region to the growth region is caused, accelerating the growth rate of the region between the wider masks. While acceleration of growth rate is caused through the foregoing two mechanisms, the dominant cause is the gas phase diffusion.

Variation of Composition

Variation of crystal composition is mainly due to variation of the ratio of the group III material (In and Ga in case of InGaAsP) in the crystal. Variation of the group III ratio is caused by the following reason. Material diffusion in the gas phase is inherent in selective growth. Since, there is a difference in decomposition rate or diffusion rate in In material and Ga material, the concentration ratio of In and Ga will vary during gas phase diffusion from the mask region. Therefore, by varying the mask width, concentration ratio of In and Ga supplied to the growth region may be varied. In other words, when the mask width becomes greater, the concentration of In becomes higher making bandgaps of InGaAs and InGaAsP narrower and the lattice constant of the same greater.

Due to the reason set forth above, when the mask shown in FIG. 4B is used, a thick semiconductor layer is formed in region I where the mask width is wide and the mask gap is narrow, thereby making the well width large and the bandgap narrower. Also, due to higher In composition in the semiconductor layer, the bandgap becomes still narrower.

Conversely, in the region II where the mask width is narrow and mask gap width is wide, the semiconductor layer is formed thinner to make the bandgap of the quantum well active layer wider.

Figure 6:
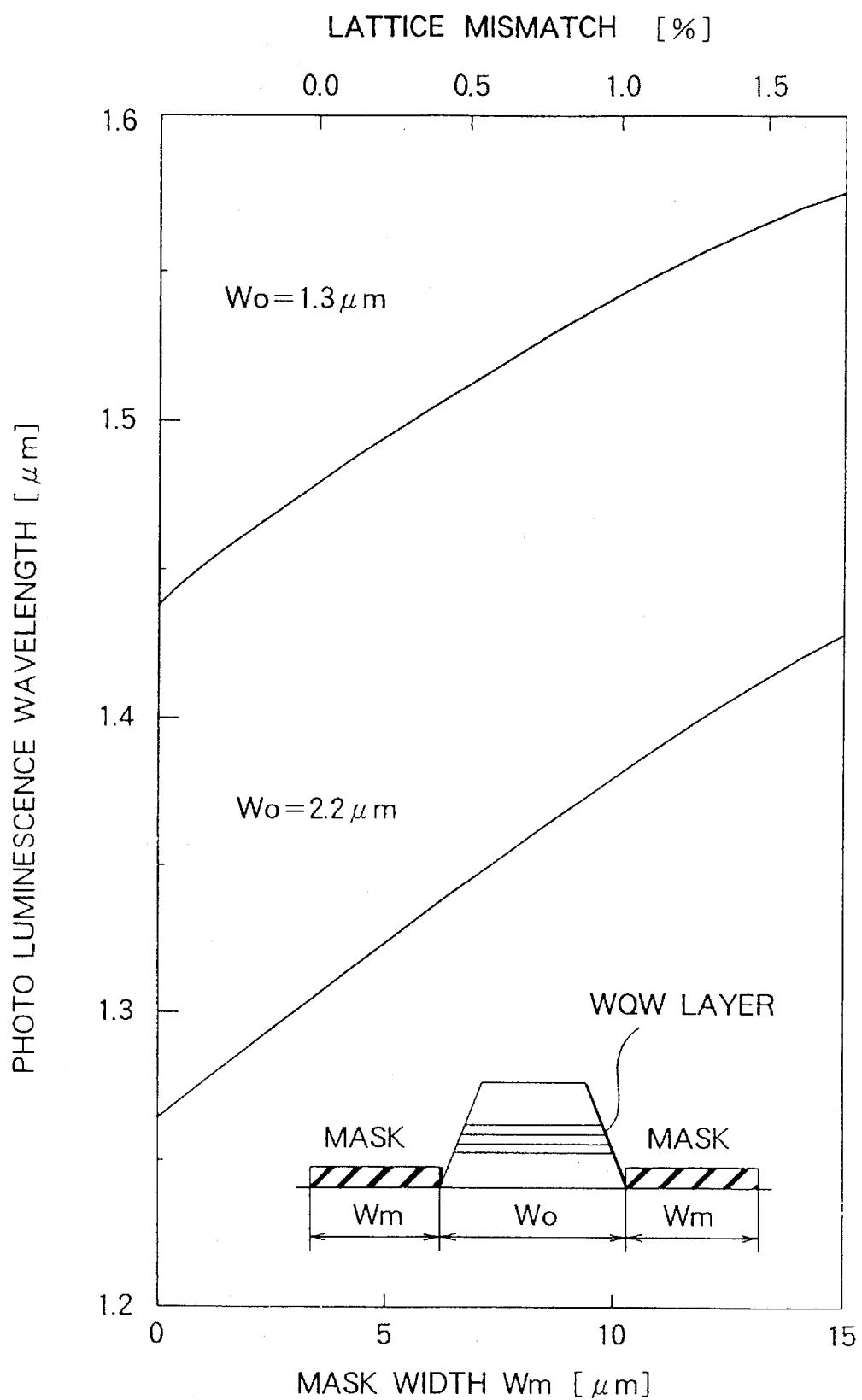
FIG. 6 is a characteristic curve for explaining the effect of the present invention.

FIG. 6 shows the dependence of photo luminescence wavelength on the mask width Wm and the lattice-mismatch. The mask width Wm is varied with respect to the mask pattern of FIG. 4B. Here, the well layer is InGaAs and the barrier layer is an 1.13 μm composition InGaAsP. Also, the well width is 2.1 nm when W0=2.2 μm and Wm=3 μm, and 8.3 nm when W0=1.3 μm and Wm=13 μm. Furthermore, the lattice-mismatch is 0.0% when Wm=3 μm and +0.15% when Wm=13 μm.

Figure 1:
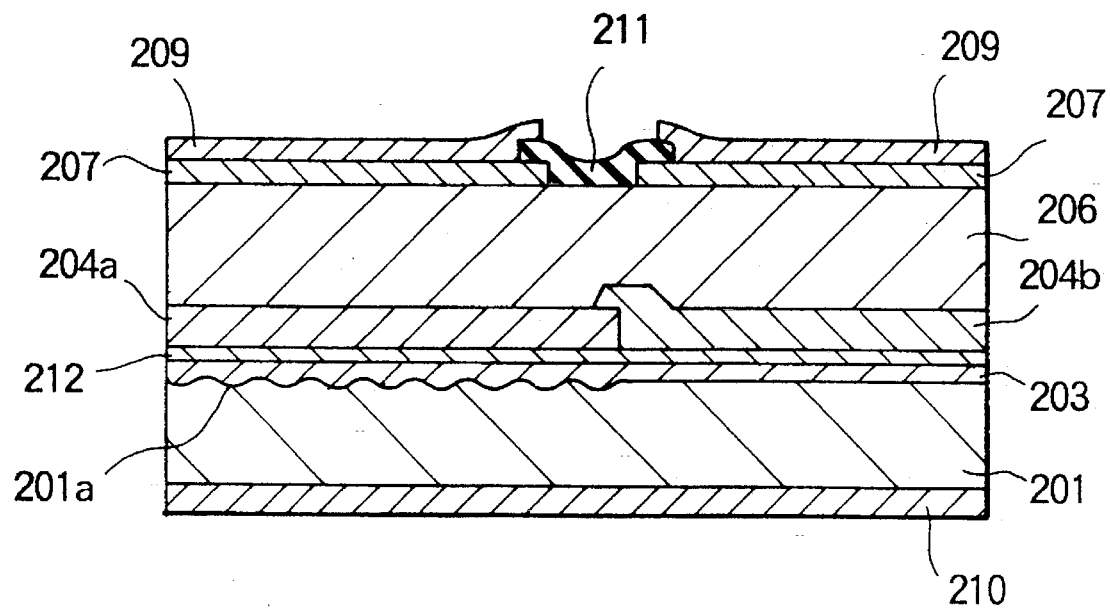
FIG. 1 is a section of a semiconductor optical device to be fabricated by the first prior art set forth above.
Figure 2A:
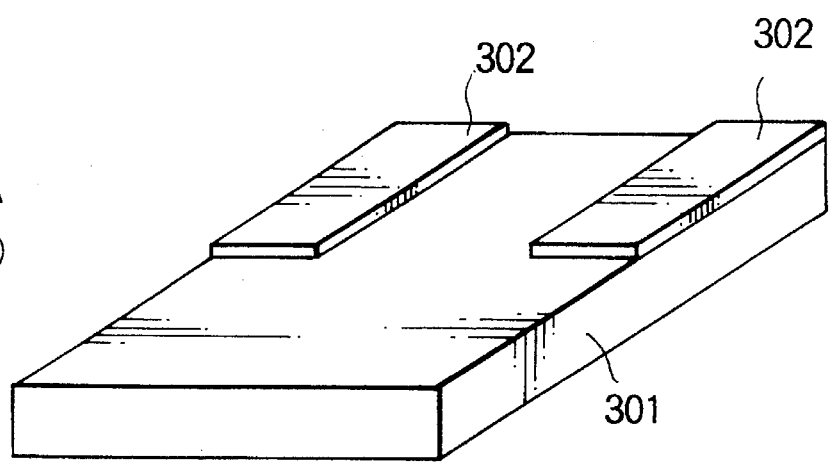
FIGS. 2A to 2C are perspective views and section showing a sequence of fabrication process steps in the second and third prior arts set forth above.
Figure 2B:
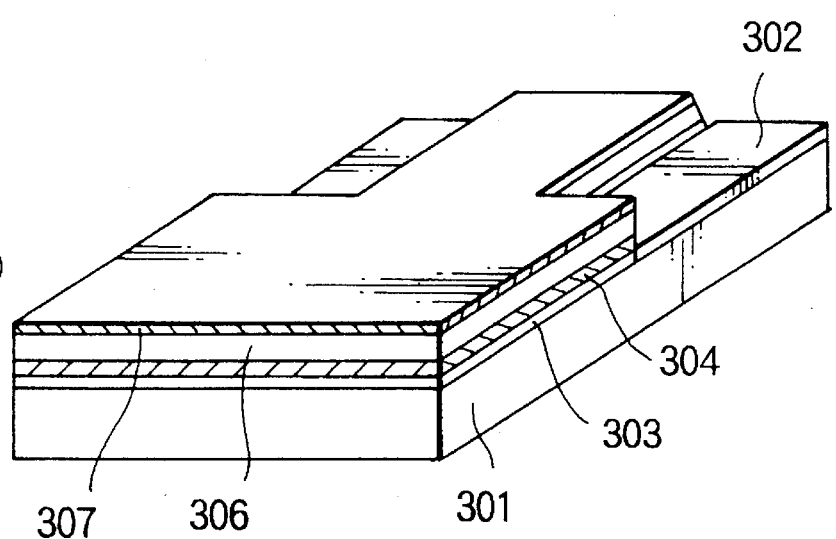
Figure 2C:
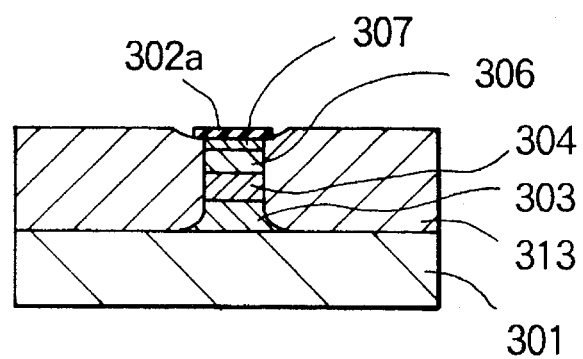
Figure 3A:
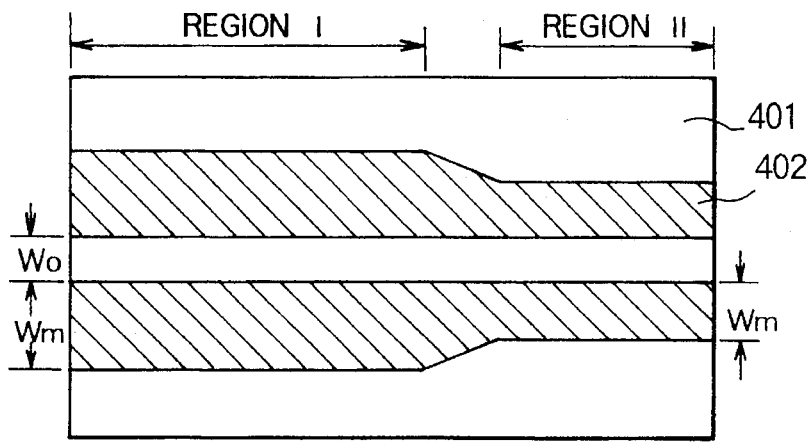
FIGS. 3A and 3B are an illustration of a mask pattern and a characteristic curves in the fourth prior art as set forth above.
Figure 3B:
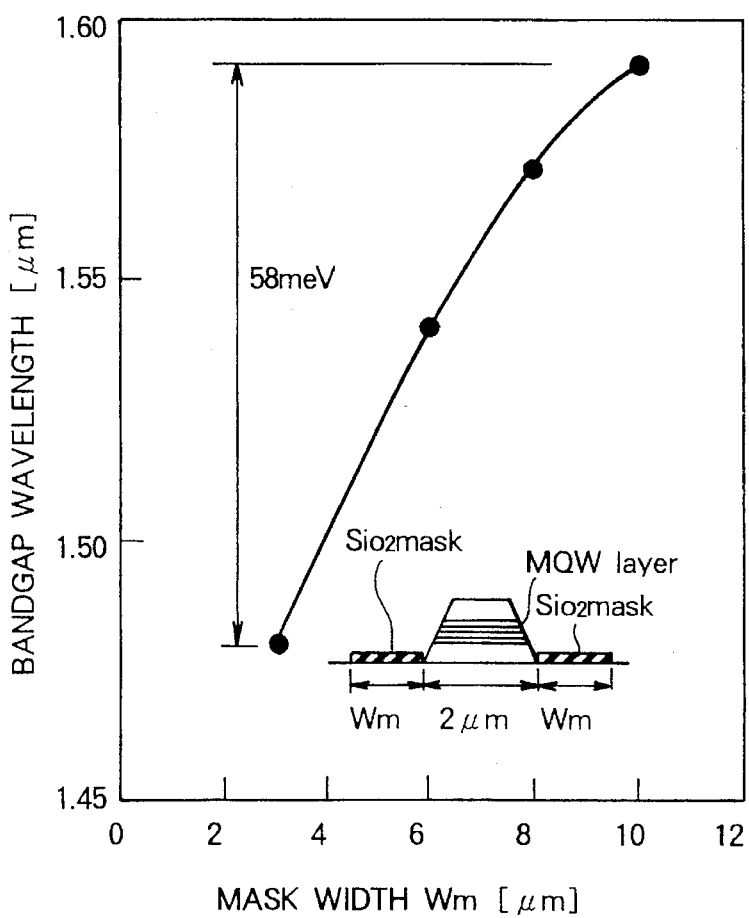

As set forth above, by combining the method of varying the mask width with the method of varying the mask gap width, variation of composition can be reduced while maintaining the same bandgap difference as compared with the case where the bandgap difference is attained by varying the mask width only. Therefore, lattice-mismatch can be reduced. Thus, it becomes possible to form a thick active layer. Alternatively, it is also possible to vary the effective bandgap wavelength of the quantum well from 1.3 μm to 1.56 μm (159 meV in energy difference) as shown in FIG. 3 while restricting the lattice mismatch to be less than or equal to 0.15%.

Figure 7A:
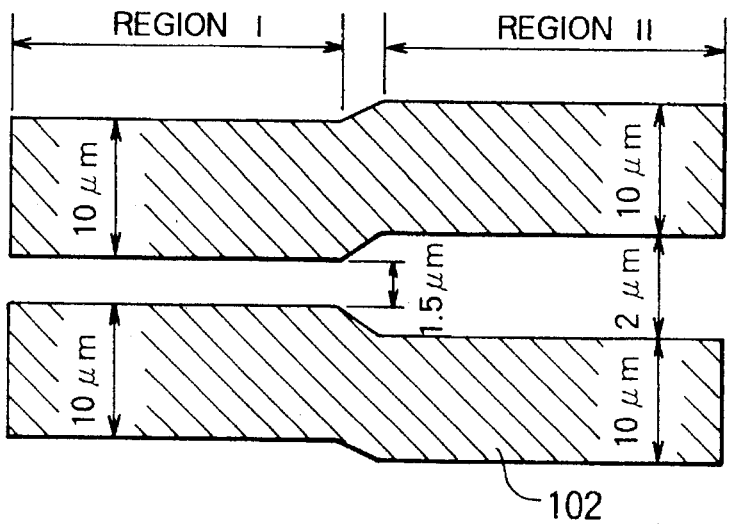
FIGS. 7A to 7C is a pattern illustration and sections showing sequence of steps in the first embodiment of a semiconductor optical device fabrication process according to the invention.
Figure 7B:
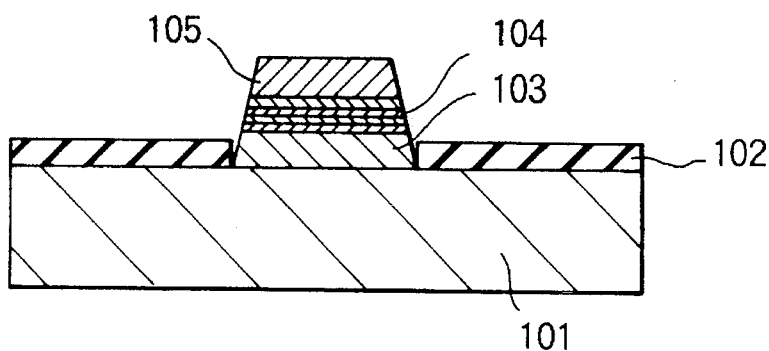
Figure 7C:
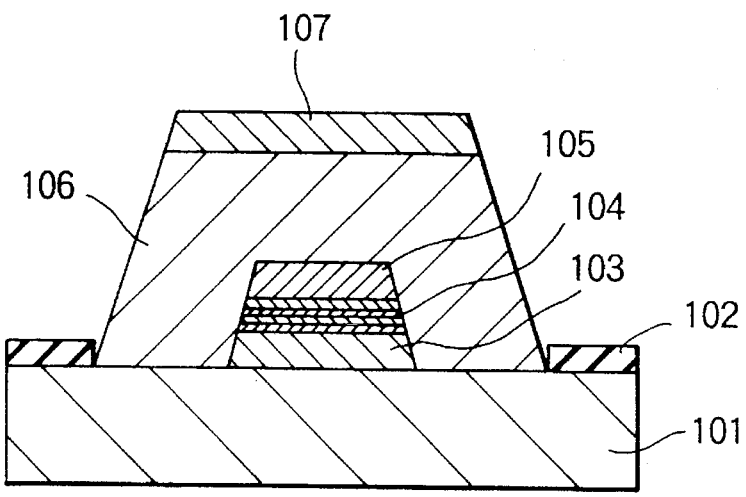
Figure 8:
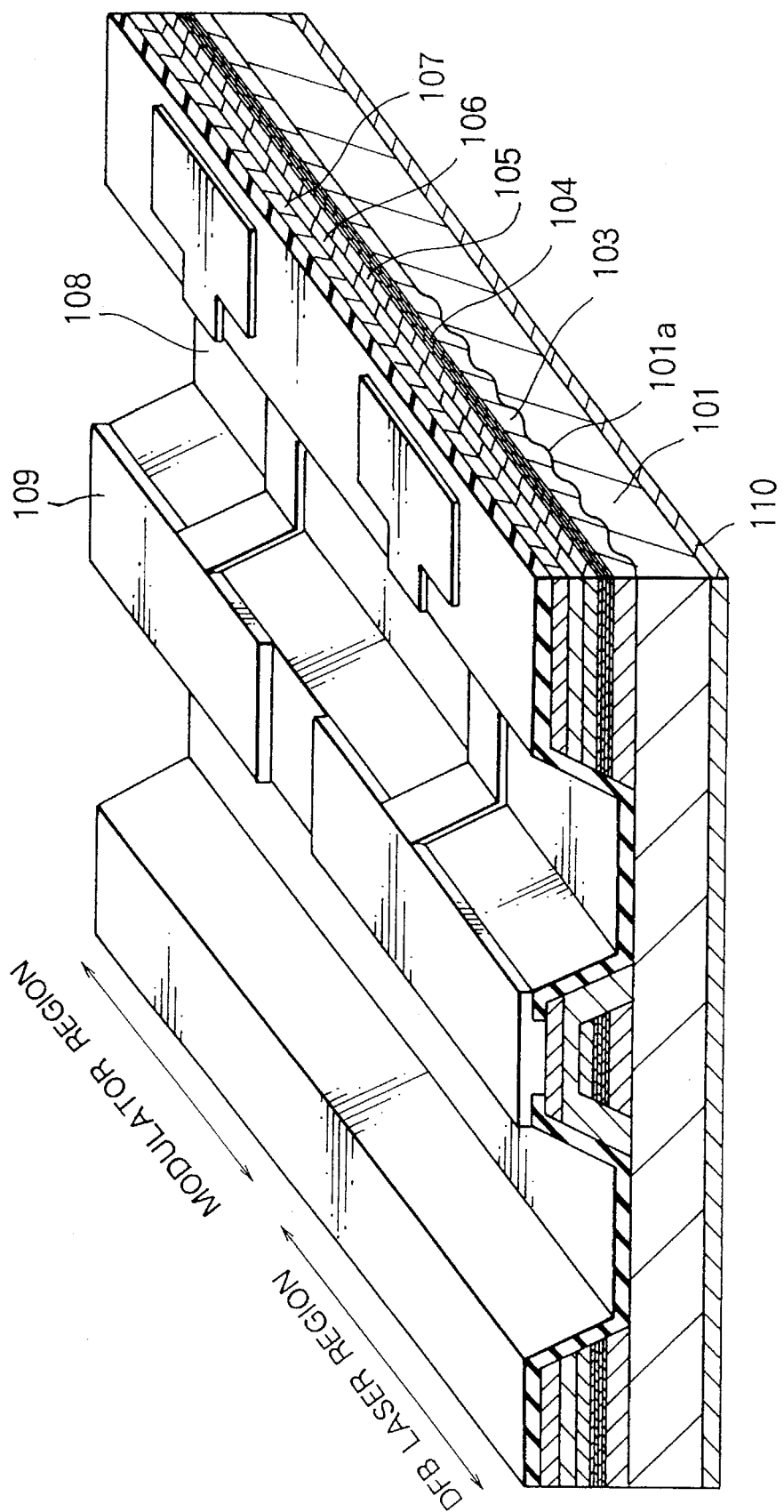
FIG. 8 is a perspective view of the semiconductor optical device fabricated by the first embodiment of the fabrication process according to the invention.

The preferred embodiment will be discussed hereinafter. The first embodiment of the semiconductor optical device fabrication process according to the present invention will be discussed with reference to FIG. 7A to FIG. 7C and FIG. 8. FIG. 7A to FIG. 7C are illustration of mask pattern and section in order of the process steps. FIG. 8 is a perspective view of an integrated light source comprising a DFB laser and an optical modulator.

At first, as shown in FIG. 7A and FIG. 7B, on an n-type InP substrate 101, SiO$_2$ is deposited by a CVD method.

Then, patterning of SiO$_2$ is performed to form SiO$_2$ masks 102 striped in the <011> direction of the InP substrate. Here, the mask gap width is 1.5 μm in region I and 2 μm in region II, and the mask widths are 10 μm in both regions. It should be noted that, prior to deposition of SiO$_2$, a diffraction grating 101a (see FIG. 8) is formed on the InP substrate at the position corresponding to the region I.

On the substrate patterned by the SiO$_2$ mask 102, an optical waveguide layer 103 of 1.2 μm composition InGaAsP with a thickness of 0.1 μm, an MQW (multiple-quantum well) 104 comprised of InGaAs well layer and 1.3 μm composition InGaAsP barrier layer, and a 0.1 μm thick p-type InP layer 105 are selectively grown by MOVPE (FIG. 7B).

Next, as shown in FIG. 7C, by removing a part of the SiO$_2$ mask 102 to widen the width of the opening to 6 μm, p-type InP clad layer 106 (1.5 μm thick), and p-type InGaAs cap layer 107 (0.2 μm thick) are grown selectively.

It should be noted that it is also possible to remove the SiO$_2$ mask 102 entirely and grow a p-type InP clad layer on the entire surface.

The bandgap wavelength of the selectively grown layers thus formed were measured by microscopic photo-luminescence. Region I was 1.55 μm and region II was 1.49 μm. Also, from the measured values of layer thickness and quantum level calculation, the lattice mismatch of the quantum well structures formed by the selective growth were both less than or equal to 0.1%.

As shown in FIG. 8, after completion of the step of FIG. 7C, the SiO$_2$ mask 102 was removed and SiO$_2$ layer 108 was newly formed over the entire surface. After formation of an electrode window, Ti-Au electrode 109 was formed on the surface of the substrate and Ti-Au electrode 110 was formed on the back surface of the substrate to form DFB laser/optical modulator integrated light source. It should be noted that while not shown on the drawings, a high reflection film (reflection index 80%) was coated on the laser side facet surface and a low reflection film (reflection index 0.1%) was coated on the modulator side facet. The device length was 500 μm for the laser, 200 μm for the modulator and 50 μm for the isolation region. This device was found to have a threshold of 10 mA, an optical output of 15 mW from the modulator side under an operation current of 100 mA and a maximum optical output of 25 mW while still maintaining single longitudinal mode emission. Also, extinction ratio upon application of a reverse bias of 3 V on the optical modulator side was 20 dB.

Figure 9:
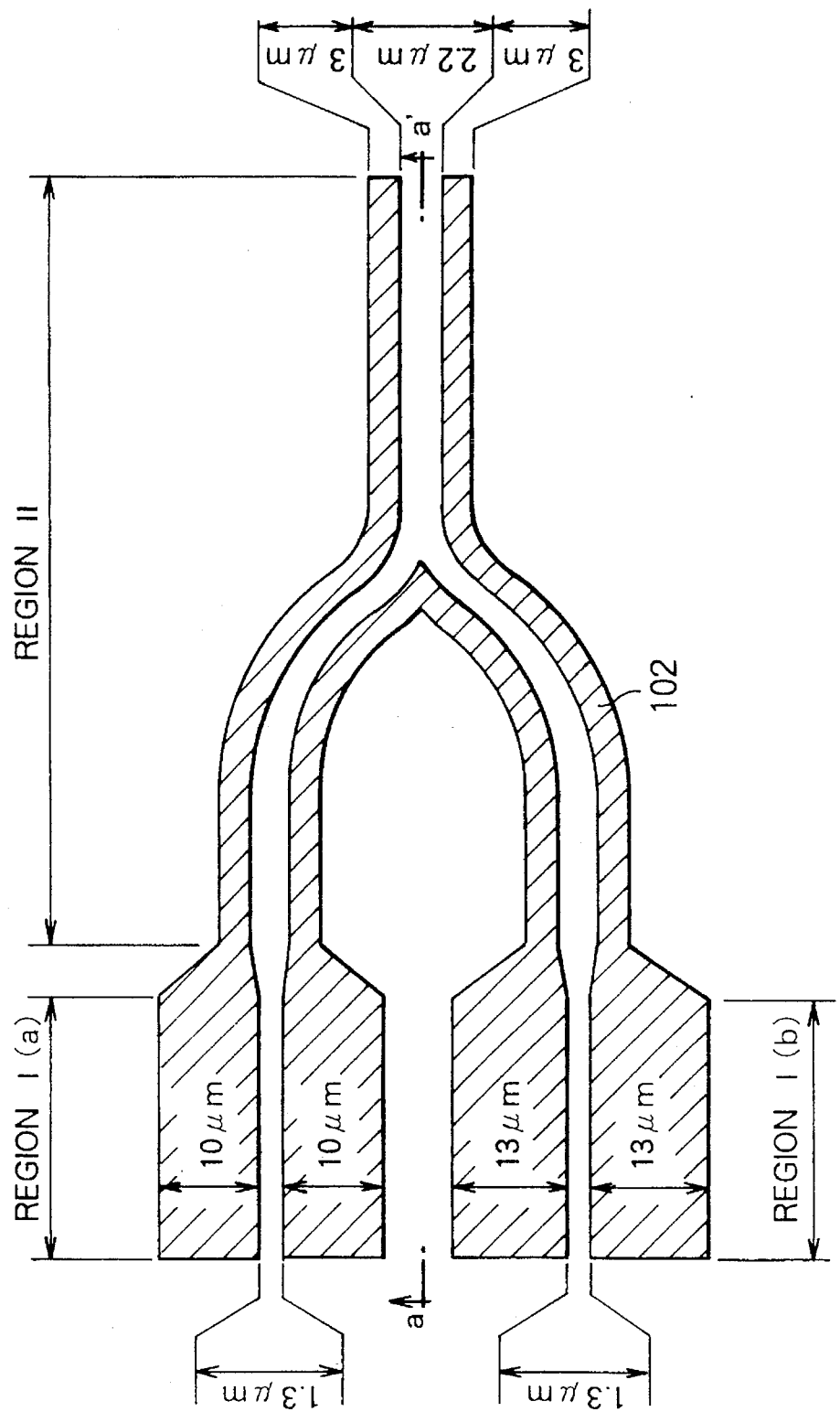
FIG. 9 is an illustration of a mask pattern for explaining second embodiment of the invention.
Figure 10:
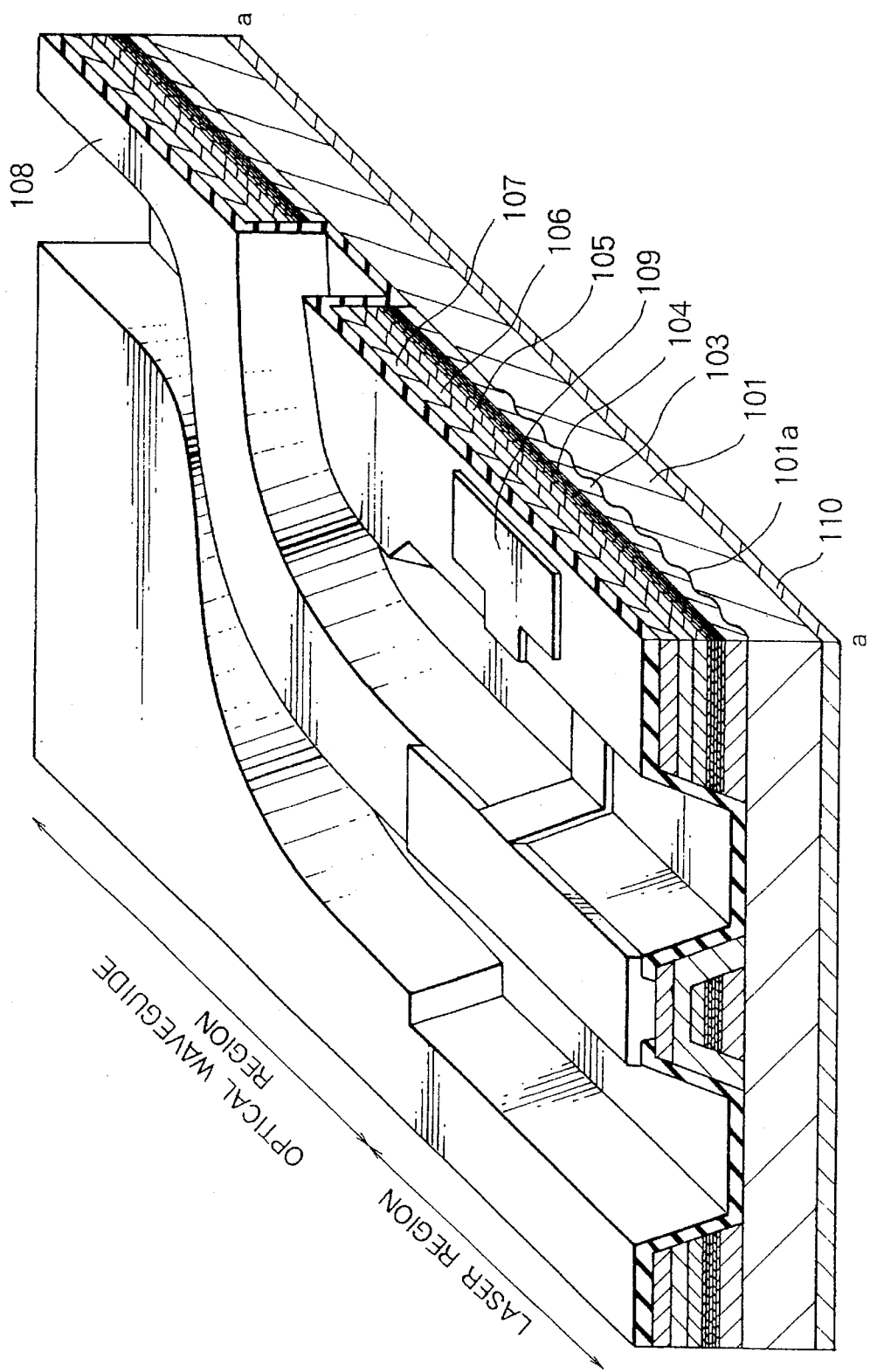
FIG. 10 is a partially sectioned perspective view of the second embodiment of the semiconductor optical device according to the invention.

Next, the second embodiment of the semiconductor optical device fabrication process of the present invention be discussed with reference to FIG. 9 and FIG. 10. FIG. 9 is a plan view showing a pattern of a growth blocking mask to be employed in the second embodiment, and FIG. 10 is a partially sectioned perspective view (sectioned along line a-a' of FIG. 9) of a wavelength division multiplexing (WDM) light source. It should be noted that in FIG. 9 and FIG. 10, the like reference numerals represent like elements to FIG. 7A to FIG. 7C.

At first, in a laser region (region I(a) and region I(b)) of n-type InP substrate 101, a diffraction grating 101a was formed. On the diffraction grating, SiO$_2$ mask 102 was formed with the waveguide oriented in the <011> direction. Thereafter, by MOVPE method, a 0.1 μm thick InGaAsP optical waveguide layer 103 having 1.2 μm composition, a MQW active layer 104 comprised of an InGaAs well layer and a 1.3 μm composition InGaAsP barrier layer, and a 0.1 μm thick p-InP layer 105 were grown selectively.

Next, by partially removing the SiO$_2$ mask 102 to widen the opening, p-type InP clad layer 106 is formed in a layer thickness of 1.5 μm, and P-type InGaAs cap layer 107 were selectively grown.

The bandgap wavelengths of the selective growth layer was measured with a microscopic photo luminescence measurement. The wavelength was 1.54 μm at region I(a), 1.56 μm at region I(b) and 1.30 μm at region II. On the other hand, the lattice mismatch of the quantum well structure formed as measured through the measurement, was 0.10% in region I(a), 0.15% in region I(b) and 0.0% in region II.

Finally, after the electrode forming process, the WDM light source, in which the laser and the optical waveguide are integrated is obtained as shown in FIG. 10.

The element length was set to be 300 μm at the laser side and to be 1000 μm in the modulator side. Also, while not illustrated on the drawings, a high reflection film (reflection index 80%) is coated on the laser side facet and a low reflection layer (reflection index 0.1%) is coated an the waveguide side facet. Evaluating this element, both lasers of regions I(a) and (b) had a losing threshold of 10 mA, and for an operating current of 100 mA, an optical output of 20 mV from the waveguide side. Also, the losing wavelength was 1.552 μm in region I(a) and 1.557 μm in the region I(b).

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fabrication process for forming a semiconductor optical device comprising:

a first step of forming a pair of growth blocking masks on a first conductivity type compound semiconductor layer to define a plurality of gap regions in-between said pair of masks, said plurality of gap regions having different gap widths in an optical waveguiding direction; and a second step of selectively forming an active layer having different bandgaps in an active region including at least a quantum well and a second conductivity type semiconductor layer in said plurality of gap regions by selective epitaxial growth, wherein the bandgap of the active layer in one of said gap regions is smaller than the bandgap of the active layer in another of said gap regions to accommodate a plurality of lasers of different wavelengths.

2. A fabrication process for forming a semiconductor optical device comprising:

a first step of forming a pair of growth blocking masks on a first conductivity type compound semiconductor layer to define a plurality of gap regions in-between said pair of masks, said plurality of gap regions having different gap widths in an optical waveguiding direction, wherein said pair of growth blocking masks are formed to have an equal mask width over the entire length of said mask in the optical waveguiding direction; and a second step of selectively forming an active layer having different bandgaps in an active region including at least a quantum well and a second conductivity type semiconductor layer in said plurality of gap regions by selective epitaxial growth, wherein the bandgap of the active layer in one of said gap regions is smaller than the bandgap of the active layer in another of said gap regions to accommodate a plurality of lasers of different wavelengths.

3. The semiconductor optical device fabrication process as set forth in claim 1, wherein said pair of growth blocking masks have a narrower mask width at a region having a wider gap width than at a region having a narrower gap width.

4. The semiconductor optical device fabrication process as set forth in claim 1, which further comprises a step following said second step, of removing at least a portion of said growth blocking masks adjacent to said selectively grown semiconductor active layer and forming a clad layer surrounding said semiconductor active layer.

* * * * *